US006603354B1

(12) United States Patent
Opris

(10) Patent No.: US 6,603,354 B1

(45) Date of Patent: Aug. 5, 2003

(54) METHOD AND APPARATUS TO GENERATE AN OPTIMUM COMMON-MODE VOLTAGE IN ANALOG DIFFERENTIAL CIRCUITS

(76) Inventor: Ion E. Opris, 2198 Lark Hills Ct., San Jose, CA (US) 95138

( * ) Notice: Subject to any disclaimer, the term of this patent is extended or adjusted under 35 U.S.C. 154(b) by 0 days.

(21) Appl. No.: 10/033,553

(22) Filed: Dec. 27, 2001

(51) Int. Cl.[7] ............................ H03F 3/45; H03F 21/00

(52) U.S. Cl. .......................... 330/253; 330/258; 330/11

(58) Field of Search ................................ 330/253, 258, 330/11

(56) References Cited

U.S. PATENT DOCUMENTS 4,616,189 A * 10/1986 Pengue, Jr. ................. 330/253

6,509,795 B1 * 1/2003 Ivanov ....................... 330/253

FOREIGN PATENT DOCUMENTS

JP 62144412 * 6/1987

OTHER PUBLICATIONS

Salmeh et al. "A low voltage linearly tuned fully differential CMOS OTA and its applications in fitler design" IEEE Canadian Conference on electrical and Computer Engineering vol. 1, 2002 pp 393–398.*

* cited by examiner

*Primary Examiner*—Michael B Shingleton

(74) *Attorney, Agent, or Firm*—Florin Alin Corie

(57) ABSTRACT

A method and apparatus to generate an optimum common-mode voltage in analog differential circuits are described. A first output voltage is generated as a function of a power supply voltage and a positive saturation voltage in a differential amplifier circuit A second output voltage is then generated as a function of a negative saturation voltage in the differential amplifier circuit. An optimum common-mode level output voltage is then calculated as an average of said first output voltage and said second output voltage to obtain a linear output range of said differential amplifier circuit.

20 Claims, 5 Drawing Sheets

METHOD AND APPARATUS TO GENERATE AN OPTIMUM COMMON-MODE VOLTAGE IN ANALOG DIFFERENTIAL CIRCUITS

FIELD OF THE INVENTION

The present invention relates generally to electronic circuits and, more particularly, to a method and apparatus to generate an optimum common-mode voltage in analog differential circuits.

BACKGROUND OF THE INVENTION

Generally, the dynamic range of analog circuits is limited by the maximum output voltage swing and the electronic noise within those circuits. The electronic noise may be minimized by increasing the power dissipation and/or the silicon area of the circuits. However, it may be also desirable to extend the dynamic range of the analog circuitry in integrated circuits by maximizing the available linear output voltage swing.

One known solution to increase the linear output voltage; swing involves the use of differential architectures, which double the output voltage swing of a typical single-ended implementation. However, the resulting output voltage swing is still limited to a fraction of the power supply voltage.

The information content in typical differential circuits is carried by the difference in value of two output signals moving in opposite directions. The common-mode level of the output signals within such typical differential circuits needs to be set to a specific value and all such differential circuits use one of many known mechanisms to adjust the average of the two output signals at the common-mode level. However, in all such differential circuits, the common-mode level is either fixed, e.g., being set by a band gap voltage, or it tracks the power voltage supply, e.g., being set at mid-supply.

SUMMARY OF THE INVENTION

A method and apparatus to generate an optimum common-mode voltage in analog differential circuits are described. A first output voltage is generated as a function of a power supply voltage and a positive saturation voltage in a differential amplifier circuit. A second output voltage is then generated as a function of a negative saturation voltage in the differential amplifier circuit. An optimum common-mode level output voltage is then calculated as an average of said first output voltage and said second output voltage to obtain a linear output range of said differential amplifier circuit.

Other features and advantages of the present invention will be apparent from the accompanying drawings, and from the detailed description, which follows below.

BRIEF DESCRIPTION OF THE DRAWINGS

The present invention is illustrated by way of example and not intended to be limited by the figures of the accompanying drawings in which like references indicate similar elements and in which.

DETAILED DESCRIPTION

According to embodiments described herein, a method and apparatus to generate an optimum common-mode voltage in analog differential circuits are described.

In the following detailed description of embodiments of the invention, reference is made to the accompanying drawings in which like references indicate similar elements, and in which are shown by way of illustration specific embodiments in which the invention may be practiced. These embodiments are described in sufficient detail to enable those skilled in the art to practice the invention, and it is to be understood that other embodiments may be utilized and that logical, mechanical, electrical, functional, and other changes may be made without departing from the scope of the present invention. The following detailed description is, therefore, not to be taken in a limiting sense, and the scope of the present invention is defined only by the appended claims.

Figure 1A:
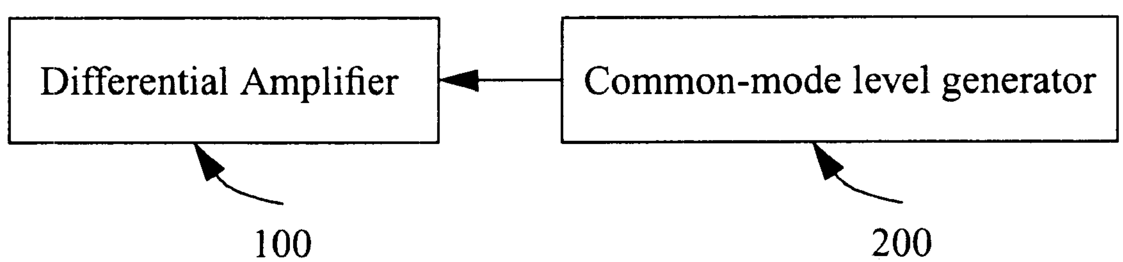
FIG. 1A is a block diagram of a circuit to output an optimum common-mode level voltage, according to one embodiment of the present invention.

FIG. 1A is a block diagram of a circuit to output an optimum common-mode level voltage, according to one embodiment of the present invention. As illustrated in FIG. 1A, the circuit includes an operational amplifier circuit 100 coupled to a common-mode level generator module 200, which will be described in further detail below.

In one embodiment, the operational amplifier circuit 100 is similar to an operational amplifier disclosed in U.S. Pat. No. 5,847,607 to Lewicki et al. and assigned to National Semiconductor Corporation of Santa Clara, Calif., which is incorporated herein by reference. The operational amplifier circuit 100 has an increased de voltage gain through use of active cascode devices on input devices, as shown below in connection with FIG. 1B. In one embodiment, the common-mode level generator module 200 is configured to output an optimum common-mode level output voltage Vcm, as described in further detail below in connection with FIGS. 2 and 3.

Figure 1B:
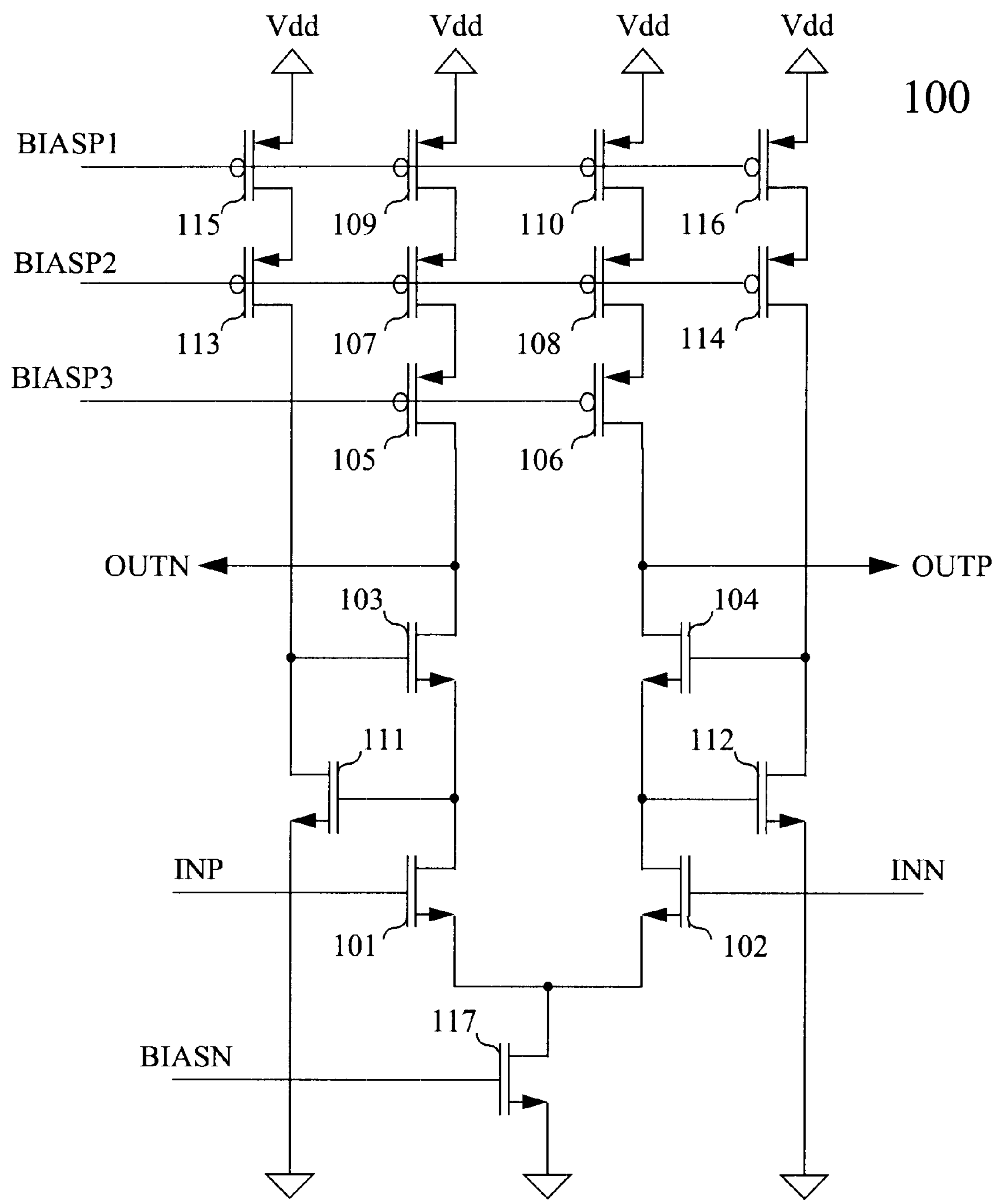
FIG. 1B is a schematic diagram of a prior art operational amplifier circuit.

FIG. 1B is a schematic diagram of a prior art operational amplifier circuit 100. As illustrated in FIG. 1B, transistors 101 and 102 form the input differential stage, which is cascoded by transistors 103 and 104 to provide a higher output voltage gain. Transistors 105–116, for example MOS transistor devices, are used to form current sources to bias the output.

The active cascode device has the advantage of increasing the output impedance without increasing the number of MOS transistor devices, thereby maximizing the available range for the output swing. However, the linear output range of each differential output varies with process, power supply voltage, and temperature and might not be centered at mid-supply, or even at a different fixed level. If all devices illustrated in FIG. 1B are biased at the edge of saturation in order to increase the linear range at each output, a voltage drop on each MOS transistor device has to be greater than:

$$V_{dsat}=V_{gs}-V_{th} \quad (1)$$

In Equation 1, Vdsat is the saturation voltage, Vgs is the gate-to-source voltage, and Vth is the threshold voltage of the corresponding MOS transistor device. The linear output range for each of the differential outputs shown in FIG. 1B is limited by:

$$\Delta V_{out}=V_{dd}-V_{dsat109}-V_{dsat107}-V_{dsat105}-V_{dsat103}-V_{th111}-V_{dsat111} \quad (2)$$

In Equation 2, Vdd is the power supply voltage, and Vdsatx and Vthx are the saturation voltage and the threshold voltage of respective MOS transistor devices. The maximum output linear range calculated using the Equation 2 is not centered at half the power voltage supply (Vdd/2), but rather at the optimum common-mode level voltage calculated using the equation:

$$Vcm_{opt}=\frac{V_{dd}-V_{dsat109}-V_{dsat107}-V_{dsat105}+V_{dsat103}+V_{th111}+V_{dsat111}}{2} \quad (3)$$

In Equation 3, the optimum common-mode level voltage $Vcm_{opt}$ depends on the values of Vdsatx and Vthx with opposite signs. The saturation and threshold terms in Equation 3 include values corresponding to MOS transistor devices of opposite polarity. As a result, the optimum common-mode level voltage $Vcm_{opt}$ varies with process variations. Also, at high temperatures, the Vth threshold voltage value is lower, while the Vdsat saturation voltage value is higher due to lower electron and hole mobility, which results in a pronounced temperature variation for the calculated optimum common-mode level voltage $Vcm_{opt}$.

Due to the process and temperature variations, the optimum common-mode level voltage $Vcm_{opt}$ value varies by more than 150 miliVolts (mV). Because of symmetrical differential outputs, the corresponding reduction in the linear differential output range is more than four times the variation of the $Vcm_{opt}$ value, i.e. 600 mV, which becomes very significant for power supply voltages Vdd that approach 1.8 V or below.

Figure 2:
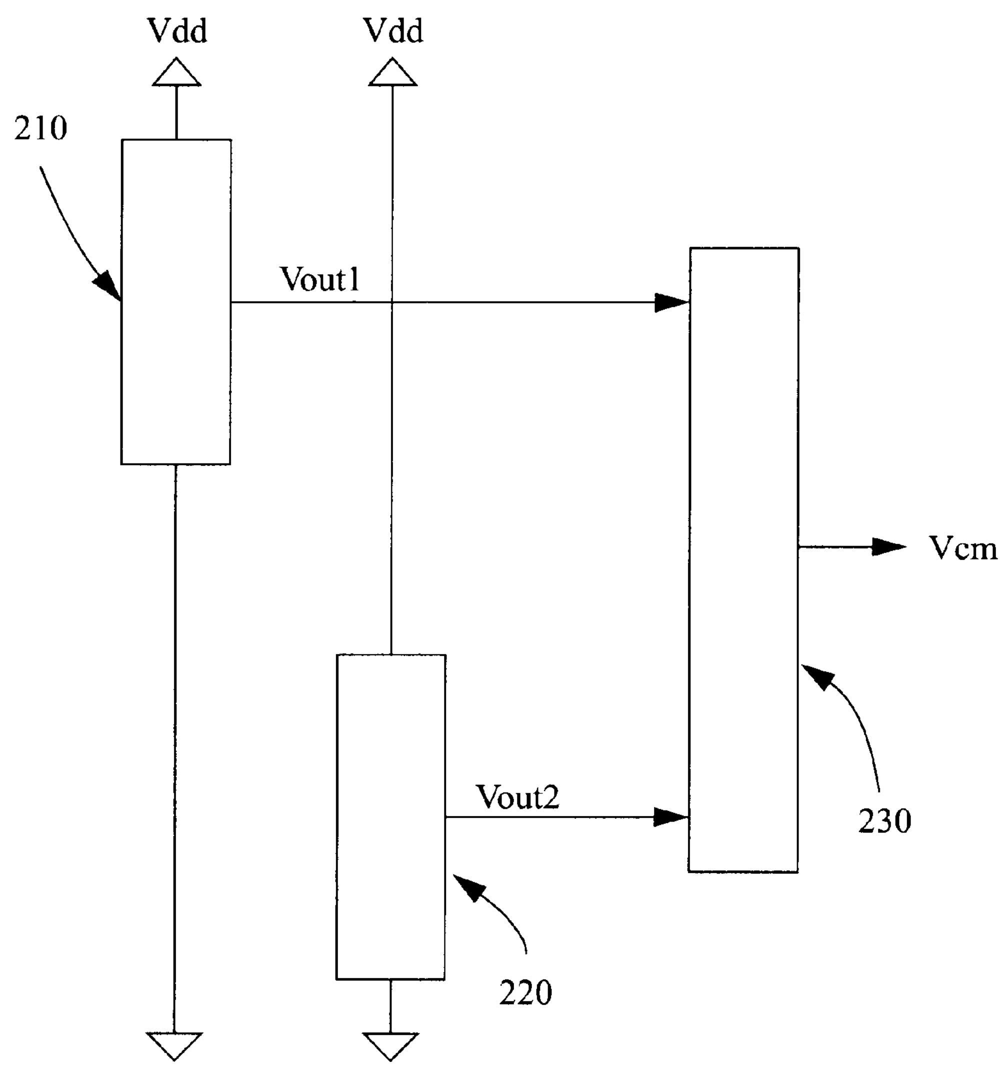
FIG. 2 is a block diagram of one embodiment of an apparatus to generate an optimum common-mode voltage in analog differential circuits.

FIG. 2 is a block diagram of one embodiment of an apparatus to generate an optimum common-mode voltage in analog differential circuits. As illustrated in FIG. 2, in one embodiment, the apparatus 200, for example the common-mode level generator module 200, includes a first voltage generator block 210 generating a first output voltage Vout1. The generator module 220 further includes a second voltage generator block 220 coupled to the first voltage generator block 210,which generates a second output voltage Vout2.

In one embodiment, generator module 200 further includes an averaging generator block 230, which receives the first and second output voltages Vout1 and Vout2, calculates an optimum common-mode level output voltage Vcm, and outputs the voltage Vcm for further processing.

In one embodiment, the first voltage generator block 210 outputs a voltage Vout1 that can be calculated as follows:

$$V_{out1}=V_{dd}-V_{dsatP} \quad (4)$$

In Equation 4, $V_{DSATP}$ is the saturation voltage of the PMOS side of the operational amplifier 100 shown in FIGS. 1A and 1B. In one embodiment, the second voltage generator block 220 outputs a voltage Vout2 that can be calculated as follows:

$$V_{Out2}=V_{dsaN} \quad (5)$$

In Equation 5, $V_{DSATN}$ is the saturation voltage of the PMOS side of the operational amplifier 100 shown in FIGS. 1A and 1B. As a result, in one embodiment, the averaging generator block 230 outputs an optimum common-mode level output voltage Vcm calculated as follows:

$$V_{cm}=\frac{V_{out1}+V_{out2}}{2}=\frac{V_{dd}-V_{dsatP}+V_{dsatN}}{2} \quad (6)$$

Figure 3:
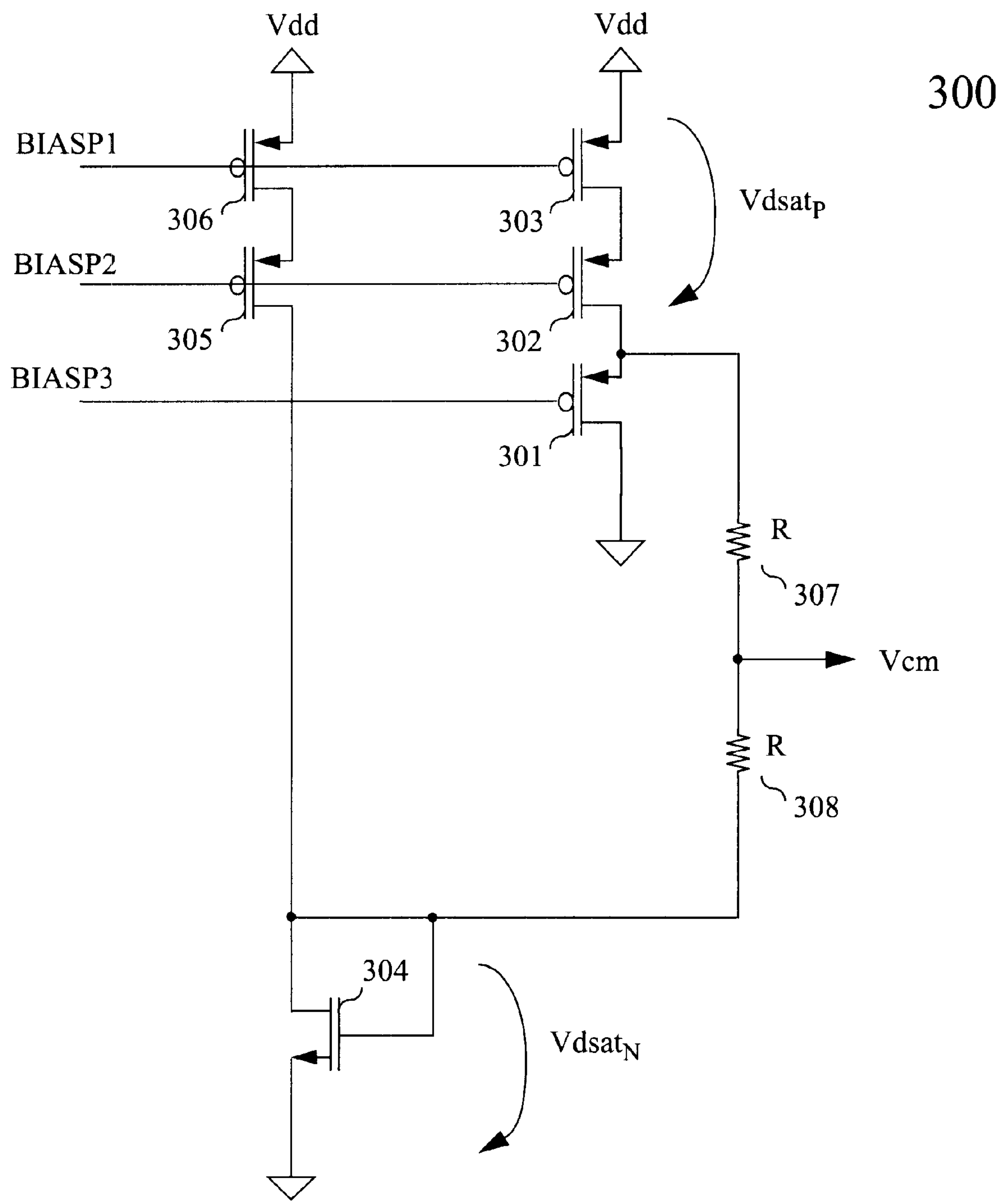
FIG. 3 is a schematic diagram of an implementation of the apparatus to generate an optimum common-mode voltage in analog differential circuits.

FIG. 3 is a schematic diagram of an implementation of the apparatus to generate an optimum common-mode voltage in analog differential circuits. As illustrated in FIG. 3, in one embodiment, the first saturation voltage $V_{DSATP}$ is generated with a replica circuit comprising the PMOS devices 301, 302, and 303. These devices are replica of the PMOS devices in the main amplifier (devices 109, 107, and, 105 in FIG. 1B). The second saturation voltage VDSATN is generated with a diode-connected NMOS transistor 304. This transistor is also a replica of the corresponding device in the main amplifier (NMOS device 111 in FIG. 1B).

In one embodiment, if the current in the resistive branches 307, 308 is neglected because it is designed to be much smaller than the current flowing through the MOS transistor devices, and if the offset of the output buffer is also, neglected, then the actual output voltage of the circuit shown in FIG. 3 is:

$$Vcm=\frac{V_{dd}-V_{dsat303}-V_{dsat302}+V_{th304}+V_{dsat304}}{2} \quad (7)$$

Figure 4:
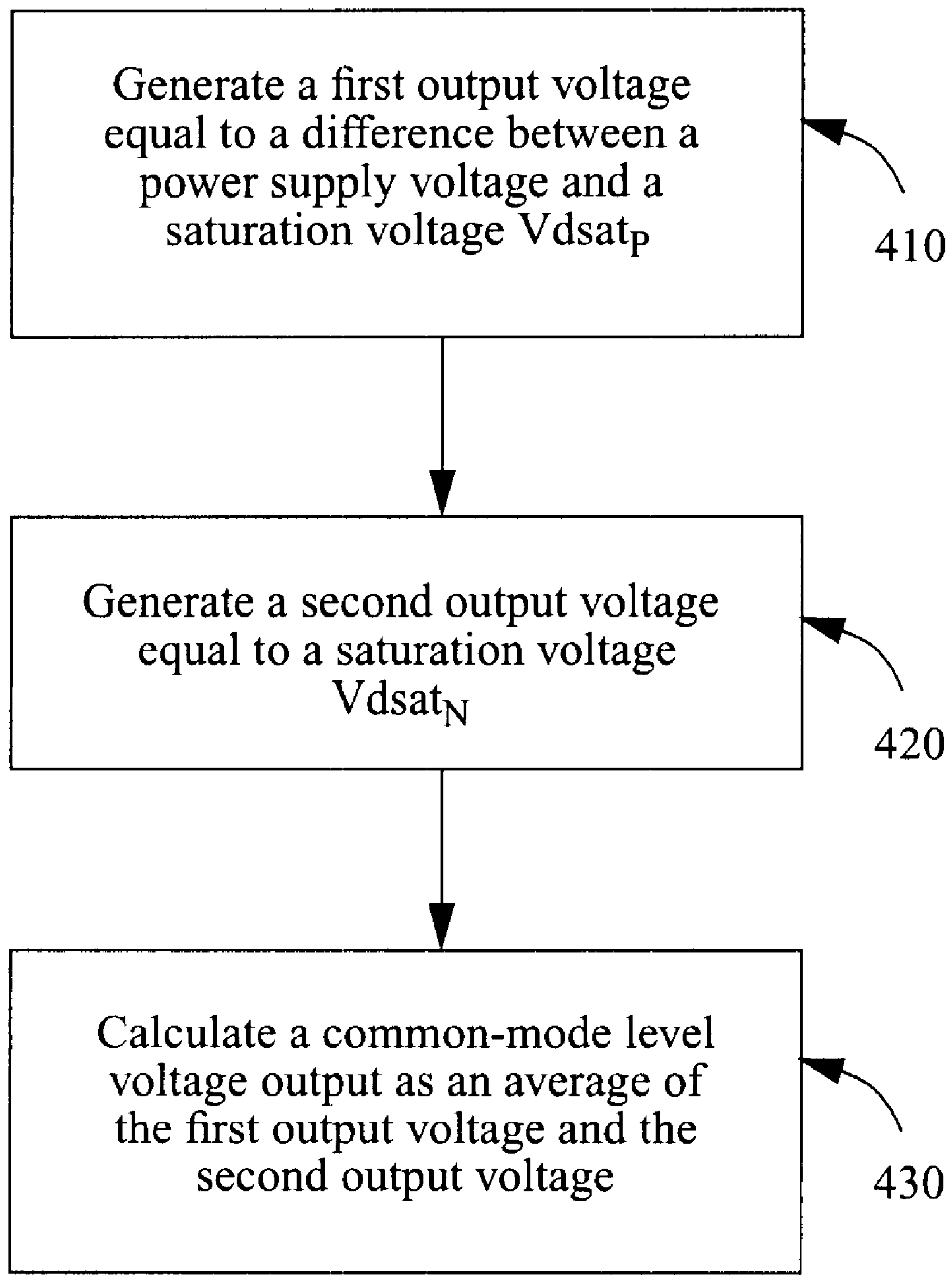
FIG. 4 is a flow diagram of one embodiment of a method to generate an optimum common-mode voltage in analog differential circuits.

FIG. 4 is a flow diagram of one embodiment of a method to generate an optimum common-mode voltage in analog differential circuits. As illustrated in FIG. 4, at processing block 410, a first output voltage equal to a difference between a power supply voltage and a positive saturation voltage VDSATP is generated. At processing block 420, a second output voltage equal to a negative saturation voltage VDSATN is generated. Finally, at processing block 430, an optimum common-mode level voltage output is calculated as an average of the first and second output voltages.

It is also to be ,understood that embodiments of the present invention may be implemented not only within a physical circuit (e.g., on semiconductor chip) but also within machine-readable media. For example, the circuits and designs discussed above may be stored upon and/or embedded within machine-readable media associated with a design tool used for designing semiconductor devices. Examples include a netlist formatted in the VHSIC Hardware Description Language (VHDL) language, Verilog language or SPICE language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above. Thus, it is also to be understood that embodiments of this invention may be used as or to support a software program executed upon some form of processing core. (such as the CPU of a computer) or otherwise implemented or realized upon or within a machine-readable medium. A machine-readable medium includes any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however; be evident that various modifications and changes may be made thereto without departing from the broader spirit and scope of the invention as set forth in the appended claims. The specification and. drawings are, accordingly, to be regarded in an illustrative sense rather than a restrictive sense.

What is claimed is:

1. A method comprising:

generating a first output voltage as a function of a power supply voltage and a positive saturation voltage in a differential amplifier circuit;

generating a second output voltage as a function of a negative saturation voltage in said differential amplifier circuit; and calculating an optimum common-mode level output voltage as an average of said first output voltage and said second output voltage to obtain a linear output range of said differential amplifier circuit.

2. The method according to claim 1, wherein said linear output range of said differential amplifier circuit has a maximum value.

3. The method according to claim 1, wherein said first output voltage is equal to a difference between said power supply voltage and said positive saturation voltage.

4. The method according to claim 1, wherein said second output voltage is equal to said negative saturation voltage.

5. The method according to claim 1, wherein said calculating further comprises:

adding said first output voltage to said second output voltage to obtain a sum voltage; and dividing said sum voltage in half to obtain said optimum common-mode level output voltage.

6. An apparatus comprising:

means for generating a first output voltage as a function of a power supply voltage and a positive saturation voltage in a differential amplifier circuit;

means for generating a second output voltage as a function of a negative saturation voltage in said differential amplifier circuit; and means for calculating an optimum common-mode level output voltage as an average of said first output voltage and said second output voltage to obtain a linear output range of said differential amplifier circuit.

7. The apparatus according to claim 6, wherein said linear output range of said differential amplifier circuit has a maximum value.

8. The apparatus according to claim 6, wherein said first output voltage is equal to a difference between said power supply voltage and said positive saturation voltage.

9. The apparatus according to claim 6, wherein said second output voltage is equal to said negative saturation voltage.

10. The apparatus according to claim 6, further comprising:

means for adding said first output voltage to said second output voltage to obtain a sum voltage; and means for dividing said sum voltage in half to obtain said optimum common-mode level output voltage.

11. A circuit comprising:

a first output generator block to generate a first output voltage as a function of a power supply voltage and a positive saturation voltage in a differential amplifier circuit;

a second output generator block coupled to said first output generator block to generate a second output voltage as a function of a negative saturation voltage in said differential amplifier circuit; and an averaging generator block to receive said first output voltage and said second output voltage and to calculate an optimum common-mode level output voltage as an average of said first output voltage and said second output voltage to obtain a linear output range of said differential amplifier circuit.

12. The circuit according to claim 11, wherein said linear output range of said differential amplifier circuit has a maximum value.

13. The circuit according to claim 11, wherein said first output voltage is equal to a difference between said power supply voltage and said positive saturation voltage.

14. The circuit according to claim 11, wherein said second output voltage is equal to said negative saturation voltage.

15. The circuit according to claim 11, wherein said averaging generator block further adds said first output voltage to said second output voltage to obtain a sum voltage, and divides said sum voltage in half to obtain said optimum common mode level output voltage.

16. A method to manufacture a circuit comprising:

coupling a first output generator block to a second output generator block, said first output generator block to generate a first output voltage as a function of a power supply voltage and a positive saturation voltage in said differential amplifier circuit, and said second output generator block to generate a second output voltage as a function of a negative saturation voltage in a differential amplifier circuit; and coupling an averaging generator block to said first output generator block and said second output generator block, said averaging generator block to receive said first output voltage and said second output voltage and to calculate an optimum common-mode level output voltage as an average of said first output voltage and said second output voltage to obtain a linear output range of said differential amplifier circuit.

17. The method according to claim 16 wherein said linear output range of said differential amplifier circuit has a maximum value.

18. The method according to claim 16, wherein said first output voltage is equal to a difference between said power supply voltage and said positive saturation voltage.

19. The method according to claim 16, wherein said second output voltage is equal to said negative saturation voltage.

20. The method according to claim 16, wherein said averaging generator block further adds said first output voltage to said second output voltage to obtain a sum voltage, and divides said sum voltage in half to obtain said optimum common-mode level output voltage.

* * * * *